United States Patent
Sherif et al.

(10) Patent No.: US 6,222,263 B1
(45) Date of Patent: Apr. 24, 2001

(54) CHIP ASSEMBLY WITH LOAD-BEARING LID IN THERMAL CONTACT WITH THE CHIP

(75) Inventors: Raed Sherif, Woodland Hills, CA (US); Hilton T. Toy, Wappingers Falls, NY (US); David J. Womac, St. Charles, IL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/420,765

(22) Filed: Oct. 19, 1999

(51) Int. Cl.[7] ............ H01L 23/34; H01L 23/28; H05K 7/10
(52) U.S. Cl. ............ 257/704; 257/710; 257/712; 257/713; 257/737; 257/738; 257/778; 257/727; 257/719; 257/718
(58) Field of Search .................. 257/724, 710, 257/712, 713, 717, 726, 675, 686, 774, 700, 701, 758, 738, 778, 718, 719, 727, 737

(56) References Cited

U.S. PATENT DOCUMENTS

| | | | |
|---|---|---|---|
| 5,006,922 | * | 4/1991 | McShane et al. ............ 257/704 |
| 5,329,160 | * | 7/1994 | Miura et al. ............... 257/710 |
| 5,414,300 | * | 5/1995 | Tozawa et al. ............. 257/704 |
| 5,436,407 | * | 7/1995 | Fehr et al. ................ 174/52.4 |
| 5,561,085 | * | 10/1996 | Gorowitz et al. ........... 257/704 |
| 5,606,200 | * | 2/1997 | Haraguchi et al. .......... 257/687 |
| 5,610,431 | * | 3/1997 | Martin ..................... 257/704 |
| 5,723,904 | * | 3/1998 | Shiga ...................... 257/698 |
| 5,731,542 | * | 3/1998 | Limper-Brenner et al. ... 174/52.4 |
| 5,789,810 | * | 8/1998 | Gross et al. .............. 257/704 |
| 5,889,323 | * | 3/1999 | Tachibana ................. 257/704 |
| 5,909,056 | * | 6/1999 | Mertol .................... 257/704 |
| 5,909,057 | * | 6/1999 | McCormick et al. .......... 257/704 |
| 5,939,784 | * | 8/1999 | Glenn ..................... 257/710 |
| 5,949,137 | * | 9/1999 | Domadia et al. ............ 257/712 |
| 5,950,073 | * | 9/1999 | IV et al. ................. 438/119 |
| 5,956,576 | * | 9/1999 | Toy et al. ................ 438/125 |
| 5,983,974 | * | 11/1999 | Sylvester ................. 164/97 |
| 6,008,536 | * | 12/1999 | Mertol .................... 257/704 |

* cited by examiner

Primary Examiner—Alexander O. Williams
(74) Attorney, Agent, or Firm—Lawrence D. Cutter; Jay H. Anderson

(57) ABSTRACT

In a direct lid attach structure incorporating thermally conductive material between a lid and an electronic circuit chip, there are provided a number of apertures in the lid. These apertures are provided directly opposite disks or pads disposed on the substrate to which the chip is attached. A hardenable adhesive such as an epoxy is disposed through the apertures and hardened in place so as to provide a bond between the lid and the underlying pad which has been previously affixed to the substrate to which the chip is attached with a compliant adhesive. There is thus provided an electronic chip assembly which allows bonded chip-to-lid thermal interfaces to be used with LGA interconnection techniques. The support structure mitigates the mechanical loads associated with LGA socketing which could otherwise damage the substrate and affect the integrity of the bonded thermal interface.

9 Claims, 1 Drawing Sheet

CHIP ASSEMBLY WITH LOAD-BEARING LID IN THERMAL CONTACT WITH THE CHIP

BACKGROUND OF THE INVENTION

The present invention is generally directed to an electronic chip assembly (which is hereinafter also referred to as a module) in which structural support is provided for a lid. More particularly, the present invention is directed to a system and method for providing structural support between the lid and substrate through the use of a curable material, such as epoxy, as a mechanism for off-loading mechanical forces applied to the lid, particularly in those situations in which a compressive load is applied during chip operation. Even more particularly, the present invention is directed to an apparatus and method for supporting a lid through the utilization of holes in the lid, together with disks or pads which are affixed to a substrate beneath lid apertures, a curable material such as epoxy disposed being between the disks and the lid and bonding the two together.

The present invention relates to semiconductor packaging both for single chip and for multi-chip modules. One significant semiconductor packaging technology employs chips that are disposed in the so-called flip-chip configuration. In this configuration small solder balls are affixed to an electronic circuit chip device at appropriate points on the device and the chip is affixed to and disposed against a substrate which contains electrical interconnections which, in turn, provide electrical signal paths to and from the chip device. Typically the packaging of the devices in a flip-chip configuration employs the so-called C4 technology. In general, in flip-chip configurations, when chip cooling is necessary, which is typically the case, a lid or heat spreader is affixed to the back side of the chip. In flip-chip configurations, a majority of the chip cooling is provided by means of access to the back side of the chip. Such cooling may be active or passive in nature, but the present invention is applicable in either case.

The C4 packaging technology is typically employed for high end, high speed electronic circuit chip devices found in high end computer systems. However, the present invention is not limited to computer systems. Nonetheless, whenever they are used, because of the high speed and high power requirements for these chip devices, it is very desirable to ensure that there is a low resistance thermal path between the chip and its lid. In particular, two approaches that are useable for the interface between the chip and its lid include (1) adhesives and (2) solder.

High end flip-chip package design also frequently utilizes land grid array (LGA) interconnection techniques between the substrate and a card or board. In order to ensure reliable, low electrical resistivity connections between interconnection pads on the bottom of the substrate and corresponding interconnection pads on the top of the card via a compressible electrically conductive interposer (hereafter referred to as an LGA socket) the module is typically clamped against the card during normal chip operation (hereinafter, said clamping is referred to as the LGA socketing load). Accordingly, it is very desirable to employ lid attachment mechanisms and structures which not only provide a reliable, highly conductive thermal path but which also distribute this mechanical load across the lid and substrate in such a manner so as not to negatively impact the structural integrity of the thermal interface, the chip, its interconnections, or the substrate.

Accordingly, it is seen that for modules that have lids of Al, Cu, CuW, AlSiC, SiC, CuSiC, AiN, diamond, graphite, or other composite materials which are directly attached to a chip with adhesive or solder it is very desirable to employ structural support, at the module level, so as to prevent damage to the chip, its interconnections, the substrate, or the thermal interface. When the module uses LGA substrate-to-card interconnections and the LGA socketing load is applied through the lid, a lid support mechanism is desired so as to distribute the mechanical LGA socketing load through the supports, thus avoiding transmission of the full load through the chip itself and thus also avoiding high internal substrate stresses.

However, it is noted that there are several features that any solution to this problem should address. In particular, it is noted that whatever mechanism is provided for this load distribution, it should fit within a low profile region having a thickness of less than approximately 1.0 mm between the lid and the substrate. Furthermore, the structure provided should be rigid after the lid is attached. Additionally, it is noted that there are requirements for a certain degree of compliance in the lateral direction as result of mismatches of thermal expansion coefficients for the materials employed within the structure. Specifically, there is a thermal expansion matching goal with respect to the lid and the substrate. In addition, the module structure employed should be able to support heavy (in the present context) lids. Accordingly, it is desirable to provide a rigid lid and a support structure which is rigid in the axis of the LGA socketing load and compliant in the plane normal to this load.

SUMMARY OF THE INVENTION

In accordance with one embodiment of the present invention a metal disc or pad is attached to at least three spaced-apart portions of a substrate (and preferably to the four corners of a substrate) with a thin layer of a compliant silicone adhesive material. A corresponding lid is provided with a hole or aperture over each disc location. The lid is larger in horizontal extent than the chip and is attached to the back of the chip. An adhesive material is dispensed through the apertures in the lid, filling in the gap between the disc and the lid thus attaching the lid to the discs below their respective holes. In particular, preferred adhesives include epoxies and or any other hardenable materials which are dispensable, but which thereafter cure or harden so as to be able to withstand compressive loads without significant compression. In preferred embodiments of the present invention, the holes provided are countersunk on both sides of the lid to provide a larger anchoring surface for the adhesive which extends into the lid apertures so as to better bond to the lid.

In accordance with this embodiment of the present invention an electronic chip assembly, in which structural support is provided, includes a substrate which has electrical conductors thereon (and preferably also therein). An electronic circuit chip is affixed via solder bumps to the substrate so as to make electrical connection to the conductors on the substrate. A thermally conductive material is disposed on the back-side of the chip so as to be in thermal contact with a substantially flat thermally conductive lid which is disposed over the chip. The lid has a greater horizontal extent than the chip, thereby providing the lid with an overhanging portion which includes at least three holes. That is, the holes (or apertures) are in the overhanging portion of the lid. A hardenable bonding material, such as epoxy, is disposed within the holes and in contact with the disks beneath the holes so as to bond the lid to the substrate (via the disks) so as produce a structure which permits transmission of compression loads from the lid directly to the substrate. The disk-to-substrate compliant adhesive's bondline and modulus are such that the amount of compression due to the LGA socketing load is low, allowing the support structure to bear a significant portion of the compressive load.

Accordingly, it is an object of the present invention to provide structural support for a lid which is directly attached to an electronic integrated circuit chip device.

It is also and object of the present invention to provide a structure which is suitable for the utilization of thermal interface materials such as solder, adhesives and epoxies.

It is yet another object of the present invention to provide a structural support mechanism which is compliant in a lateral direction while at the same time being rigid in a direction normal to the lid and substrate.

It is a still further object of the present invention to provide a load bearing support which permits lateral expansion and contraction between lid materials, substrate materials, and chip materials due to differences in thermal coefficients of expansion and differences in thermal excursions.

It is yet another object of the present invention to provide a load bearing structure which is particularly suitable for the utilization of copper, CuW, SiC, CuSiC, AlSiC, Al, graphite and diamond as a lid material.

It is also an object of the present invention to provide a lid support and attachment mechanism which prevents damage to the substrate and is compatible with alumina, glass ceramic, AlN, Mullite, FR4 and Teflon® (PTFE) substrates.

It is also an object of the present invention to prevent damage to circuit chip devices and to promote the utilization of LGA interconnection techniques for interconnection between the module and the card/board.

Lastly, but not limited hereto, it is an object of the present invention to provide improved thermal and mechanical packaging systems and materials for single chip and multi-chip modules.

The recitation above of a list of desirable objects provided by various individual embodiments of the present invention is not meant to suggest or to imply that any or all of these objects are essentially present, either individually or collectively, in the present invention in its most general form or in any of its specific embodiments.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
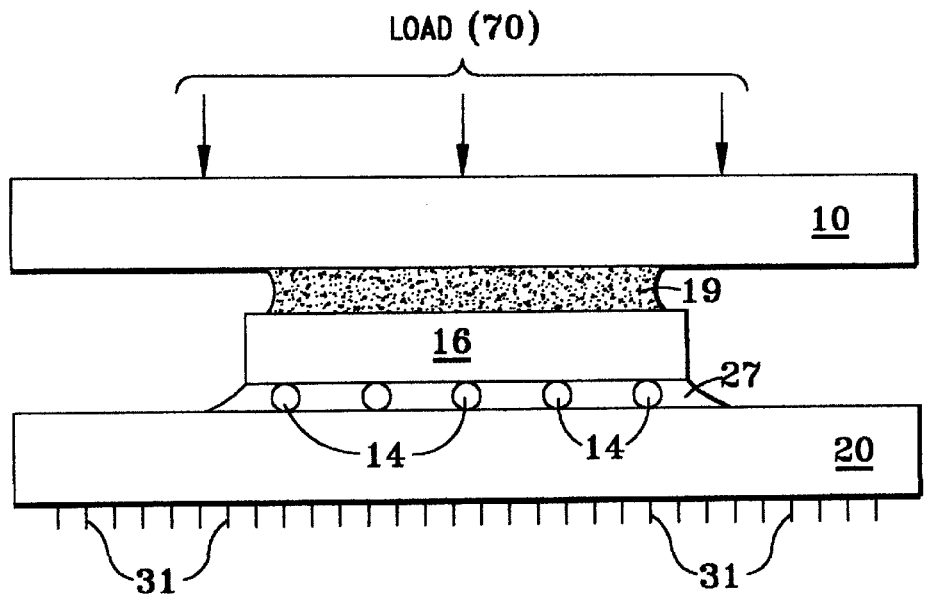
FIG. 1 (not to scale) is a side elevation view illustrating a problem solved by the present invention.

FIG. 1 illustrates one of the packaging problems discussed herein. In particular, chip 16 having solder balls 14 affixed to its face-down side is electrically connected to conductors on and (almost always also) within substrate 20, which typically comprises a multi-layer organic or inorganic structure having pins 31 or LGA pads for electrical connection to a circuit board, card or backplane. It is also noted that underfill material 27 is provided between chip 16 and substrate 20. It is solder balls 14 arranged between pads (not visible) on chip 16 which provide the electrical interconnection between chip 16 and substrate 20.

With the increasing density of electronic circuit components on chips such as chip 16, there is a concomitant increase in problems associated with heat removal from the chip. This heat removal problem is also aggravated by the desire to operate such chips at ever increasingly higher frequencies. Accordingly, one method for dealing with the thermal heat removal problem is to provide thermal interface 19 (preferably solder) between chip 16 and lid 10. In some instances, it is noted that lid 10 may actually comprise a full blown heat sink structure. While thermally conductive interface material 19 preferably comprises solder, it is also possible to use other thermally conductive epoxies, adhesives elastomers and polymers.

In preferred embodiments of the present invention, as well as in the structure shown in FIG. 1, it is desired to provide thermal interface 19 for rapid heat removal, but it is also very desirable to provide a structure which is capable of withstanding a force exerted against lid 10, such as that shown by load arrows 70 in FIG. 1. In particular, in normal chip operation it is desirable, in some technologies, to apply a continuous mechanical load to the module structure so as to provide secure, continuous and low resistance contact between substrate LGA pads and an LGA socket. It is undesirable to transfer all of this load to the center of the substrate 20 via the chip; doing so can cause the lid and substrate to bend and thus to stress the thermal interface, chip, solder balls, and chip underfill.

Figure 2:
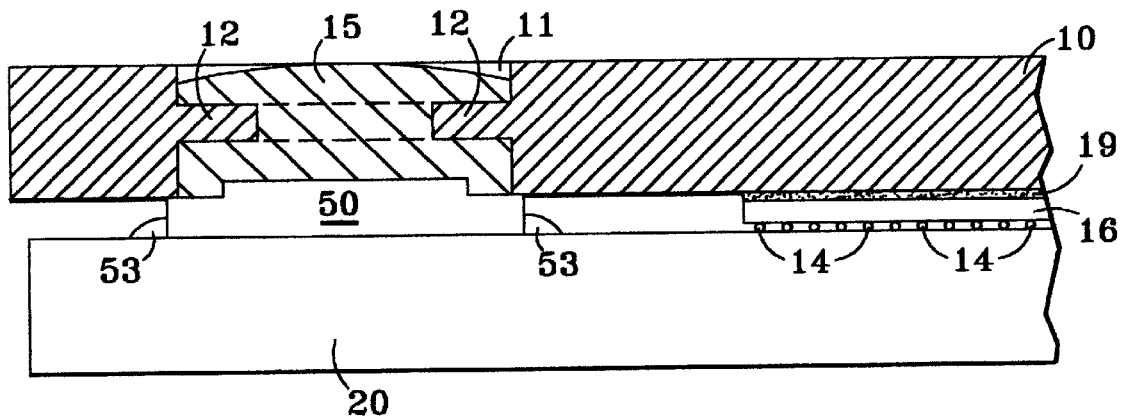
FIG. 2 is a cross sectional side elevation view illustrating one of the aperture/adhesive/pad structures of the present invention.

Accordingly, to achieve the mutually desired goals of good load distribution and thermal conduction integrity there is provided the structure shown in FIG. 2. In preferred embodiments of the present invention a plurality of at least three apertures is provided in lid 10. In particular, aperture 11 is shown disposed over disk or pad 50 which is affixed to substrate 20 by means of a compliant adhesive such as Sylgard™ 577. In particular, FIG. 2 illustrates the compliant adhesive structure as reference numeral 53. Aperture 11 is filled with hardenable adhesive 15 such as epoxy which, when cured, bonds lid 10 to pad 50. While epoxies are preferred for hardenable adhesive 15, one may employ any convenient compliant adhesive such as elastomers, polymers or silicones. Aperture 11 is preferably provided in a structure (as shown) in which a counterbored hole is provided on both sides of lid 10, so as to provide a radially inwardly extending annular portion 12 which serves to more firmly anchor lid 10 to substrate 20, and more particularly to disk 50. It is also possible to employ an inwardly extending annular portion 12 having a star pattern, such as that which might be provided in a device such as a lock washer with inwardly extending prongs.

In preferred embodiments of the invention, pad 50 comprises a stepped disk, as shown. A step in the pad is not, however, essential. Pad 50 preferably comprises a material such as steel with chromium plating or may in fact comprise aluminum, another metal, a composite material, or polymer. While substrate 20 preferably compromises a ceramic material such as alumina, it may also comprise a glass ceramic, aluminum nitride, mullite, FR4, driclad or PTFE (Teflon® or polytetrafluoroethylene). While lid 10 preferably comprises copper or aluminum, it may also comprise CuW, SiC, CuSiC, AlSiC, diamond, graphite or thermally conductive, composite materials.

In preferred embodiments of the present invention surface treatment is employed to enhance adhesion characteristics for the lid and/or the pads. In particular Cu or CuW is plated with nickel and chrome; Al SiC materials enhanced by anodization; and surface roughening is applicable to all lid or pad materials but is especially useful for metal materials such as Cu and Al.

Adhesive material 15 preferably comprises a thermoset polymer. In particular, adhesive material 15 preferably comprises a curable epoxy. Adhesive material 15 is preferably a material which is curable by heat, light, ultraviolet radiation, or which may in fact comprise a self curing material.

The structure illustrated in FIG. 2 is particularly useful in electronic circuit chip structures in which lid 10 comprises a material such as Cu, CuW, Al, SiC, AlSiC, CuSiC, diamond, graphite or AlN. In particular, it is also to be noted that the structure of the present invention provides lateral compliance to accommodate differential thermal expansion between components due to different coefficients of thermal expansion and varied thermal excursions for the materials employed. The present invention also accommodates compressive loading associated with LGA socketing by providing a rigid structure after lid 10 is attached and adhesive 15 is cured. In particular, the solution described herein provides a structure which is rigid in a direction normal to the lid (parallel to the LGA socketing load) and relatively compliant in the plane of the lid (that is in a direction normal to the LGA socketing load). The structure of the present invention is also of a sufficiently low profile that it fits in the typical 1.0 mm high gap between the substrate and the lid.

In the process of assembling the preferred structure illustrated herein, disks 50 are first attached to substrate 20 with compliant adhesive 53. Lid 10 is then attached to the chip, thereby fixing the lid into its final position which is subsequently further locked in place by the support structure. Adhesive material 15 is then introduced into apertures 11 in lid 10 to complete the solid support structure shown. In particular, adhesive material 15 such as epoxy, is introduced through lid hole openings 11, and then cured.

Accordingly, the present invention provides a structure with a rigid adhesive in a solid support which attaches a lid to a circuit chip and to an underlying substrate carrying a LAN grid array structure. In particular, the present invention provides structural support for a direct lid attach module so as to prevent substrate stress cracking in spite of LAN grid array loading. This permits the utilization of relatively heavy heat sinks to further enhance solutions to thermal problems. Additionally, thermal interface resistance is reduced. Furthermore, damage from impact, shock, and vibration to the solder thermal interface is reduced as is the potential for damage during chip structure or module handling. Accordingly, from the above it should be appreciated that all of the objects recited herein have been met by the structure described.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An electronic chip assembly in which structural support is provided, said assembly comprising:

a substrate having a surface with electrical connections thereon;

an electronic circuit chip affixed face down to said surface of said substrate so as to make electrical connections to said conductors;

thermally conductive material disposed on the non-face down side of said chip;

a substantially flat, thermally conductive lid disposed over said chip and in thermal contact with said thermally conductive material, said lid having a greater horizontal extent than said chip, said lid therefore having an overhanging portion, said overhanging portion having at least three apertures formed therethrough, said apertures being countersunk on at least one side;

at least three pads disposed on said surface of said substrate and affixed thereto, beneath each of said three apertures respectively; and hardenable adhesive material disposed within said apertures and in contact with said pads and said lid so as to bond said lid to said substrate.

2. The chip assembly of claim 1 in which said apertures are countersunk on both sides.

3. The chip assembly of claim 1 in which said adhesive material comprises epoxy.

4. The chip assembly of claim 1 in which the material of said lid is selected from the group consisting of Cu, Al, CuW, SiC, CuSiC, AlSiC, AlN, diamond, graphite, and composite materials.

5. The chip assembly of claim 1 in which said thermally conductive material comprises solder.

6. The chip assembly of claim 1 in which said thermally conductive material is selected from the group consisting of solder epoxies, adhesive, elastomers, and polymers.

7. The chip assembly of claim 1 in which said hardenable adhesive is selected from the group consisting of epoxies, elastomers, polymers, adhesives, or silicones.

8. The chip assembly of claim 1 in which said pads are of a material selected from the group consisting of metal, epoxies, and polymers.

9. The chip assembly of claim 1 in which said substrate material is selected from the group consisting of alumina, glass ceramic, AlN, mullite, boron nitride, FR4, driclad and PTFE.

* * * * *